(12) United States Patent
Konter et al.

(10) Patent No.: US 6,405,435 B1
(45) Date of Patent: Jun. 18, 2002

(54) PROCESS FOR PRODUCING OR REPAIRING COOLING CHANNELS IN MONOCRYSTALLINE COMPONENTS OF GAS TURBINES

(75) Inventors: Maxim Konter, Klingnau; Wilfried Kurz, La Conversion, both of (CH)

(73) Assignee: Alstom (Switzerland) Ltd., Baden (CH)

( * ) Notice: Subject to any disclaimer, the term of this patent is extended or adjusted under 35 U.S.C. 154(b) by 0 days.

(21) Appl. No.: 09/584,714

(22) Filed: Jun. 1, 2000

(30) Foreign Application Priority Data

Jun. 3, 1999 (EP) .............................. 99810487

(51) Int. Cl.⁷ ............................................... B23P 15/00
(52) U.S. Cl. ................... 29/889.7; 29/889.721
(58) Field of Search ................ 29/889.1, 557, 29/889.721, 890.01, 402.06, 402.07; 164/92.1; 416/97 R

(56) References Cited

U.S. PATENT DOCUMENTS

| | | | | |
|---|---|---|---|---|
| 5,047,091 A | * | 9/1991 | Khan et al. | 148/3 |
| 5,212,148 A | * | 5/1993 | Roas et al. | |
| 5,813,118 A | * | 9/1998 | Roedl et al. | 29/889.1 |
| 5,921,310 A | * | 7/1999 | Kats et al. | 164/61 |
| 6,024,792 A | * | 2/2000 | Kurz et al. | |
| 6,039,537 A | * | 3/2000 | Scheurlen | 416/97 R |
| 6,183,888 B1 | * | 2/2001 | Alperine et al. | |

OTHER PUBLICATIONS

Burkholder et al., "Allison Engine Testing CMSX–4 Single Crystal Turbine Blades and Vanes", 3rd International Charles Parsons Turbine Conference: Materials Engineering in Turbines and Compressors", New Castle Upon Tye, UK, Apr. 25–27, 1995, pp. 305–320, published by Institute of Materials, London, UK.

A. Frazier et al., "The Miniaturization Technologies: Past, Present, and Future", IEEE Transactions on Industrial Electronics, vol. 42, No. 5, Oct. 1995, pp. 423–430, published by IEEE, New York, NY.

Allison Engine Company, *Advanced Turbine Systems Program Conceptual Design and Product Development*, Quarterly Report, Nov. 1993–Jan. 1994, Publication No. DOE/MC/29257—4018, published by U.S. Department of Energy, Office of Fossil Energy, Morgantown Energy Technology Center, Morgantown, West Virginia.

* cited by examiner

*Primary Examiner*—I Cuda Rosenbaum
(74) *Attorney, Agent, or Firm*—Burns, Doane, Swecker & Mathis, L.L.P.

(57) ABSTRACT

Method for producing or repairing cooling channels (7a) of a gas turbine component (1), whereby the cooling channels (7a) are masked with a thermally stable filling material (3) on the cast gas turbine component (1), and another epitactic layer (6) is created above the ceramic material (3) with the help of a laser (4) and a powder (5). The thermally stable filling material (3) is removed by etching.

8 Claims, 4 Drawing Sheets

US 6,405,435 B1

PROCESS FOR PRODUCING OR REPAIRING COOLING CHANNELS IN MONOCRYSTALLINE COMPONENTS OF GAS TURBINES

FIELD OF THE INVENTION

The invention relates to a method for producing or repairing cooling channels in monocrystalline components of gas turbines.

BACKGROUND OF THE INVENTION

Gas turbine components impacted by hot gas have been provided with cooling air structures for a long time in order to be able to, on the one hand, increase the temperature of the hot gas and, on the other hand, extend the life span of the affected parts. Usually, these gas turbine components are cast and consist of monocrystalline super alloys. Such a super alloy based on Ni is disclosed, for example, in U.S. Pat. No. 5,759,301. This alloy has proven itself especially for very thin walls as they occur in components of gas turbines, since it does not have any grain boundaries. Grain boundaries would have a negative effect on material properties. The cooling channels can be produced during casting; a known technology for this is the Castcool technology of Allison company (cf. Burkholder et al., Allison engine testing CMSX-4 single crystal turbine blades and vanes, 3rd International Charles Parsons Turbine Conference, ISSN 0-901716-89-8). This Castcool casting process works with a ceramic core that is integrated into the casting form. But this process is unfortunately relatively expensive, due to the relatively high waste rate in the production of the very thin walls of the cooling channels. In particular, there is no way to repair chipped components with this process.

In addition, other processes are known for producing the cooling channels, among them the LIGA process (cf. "The Miniaturization Technologies-Past, Present and Future", Frazier et al., from IEEE Transactions on industrial electronics, 1995, V42, n5 (Oct.), p. 423–430, ISSN 0278-0046), and laser-based processes, such as LENS technology (Laser Engineered Net Shaping). But in practice, they are not used for producing cooling channels in monocrystalline structures, since during the production, especially as a result of the temperature action, amorphous and multicrystalline structures are created, which destroy the favorable properties of the monocrystalline structures in relation to firmness and ductility, and the very thin walls of gas turbines are more susceptible to the stresses they are exposed to. In order to avoid these disadvantages, a monocrystalline structure without grain boundaries is needed.

A process for producing a cooling structure of an airfoil is known from U.S. Pat. No. 5,640,767. But this process has the disadvantage that the base material and the second layer applied consist of different materials. This results in a weakening of the component at the contact point between the two layers.

European patent application No. EP 892 090 A1 in contrast describes a process for producing monocrystalline structures. This process employs an energy beam with a high energy density, for example a laser beam, an electron beam, or a light arc that melts a base material. To this melted area is added material that is identical to the base material or has a similar crystal structure as the base material and is also melted. During this process, the addition of energy is regulated and controlled in such a way that the solidification speed and temperature gradient result in a directional, dendritically crystalline, and not in a globulitic, solidification.

A process for repairing a monocrystalline structure is also known from European patent application No. EP 740 976 A1.

SUMMARY OF THE INVENTION

It is the objective of this invention to create a process that facilitates the production or repair of cooling channels of a gas turbine component consisting of monocrystalline structures.

According to the invention, this objective is achieved in a process in which the monocrystalline gas turbine component is cast, thermally stable filling material is applied, a monocrystalline layer is epitactically created over the thermally stable filling material, and the thermally stable filling material is removed.

The invented process has the advantage that it facilitates the production of gas turbine components with cooling channels. The thermally stable filling material can be easily removed, for example, by etching. The rate of waste of the process and its associated costs are favorably low when compared with the state of the art Castcool technology. The process also can be used several times consecutively in order to produce superimposed cooling channels. This process also makes it possible to repair cooling channel of a chipped gas turbine component.

BRIEF DESCRIPTION OF THE DRAWINGS

A preferred embodiment of the invention is shown in the accompanying drawings, in which.

Only those elements significant for the invention are shown.

DETAILED DESCRIPTION OF THE INVENTION

Figure 1:
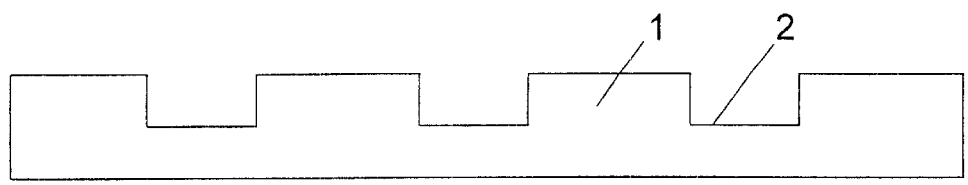
FIG. 1 shows a cast gas turbine component with a monocrystalline structure, having a prefabricated profile for the cooling channels.

FIG. 1 shows a gas turbine component 1 cast from a monocrystalline structure. This gas turbine component 1 has a profile 2 which later functions as a cooling air structure of the component 1. This profile 2 may have been created during casting, but a later machining would be possible also.

Figure 2:
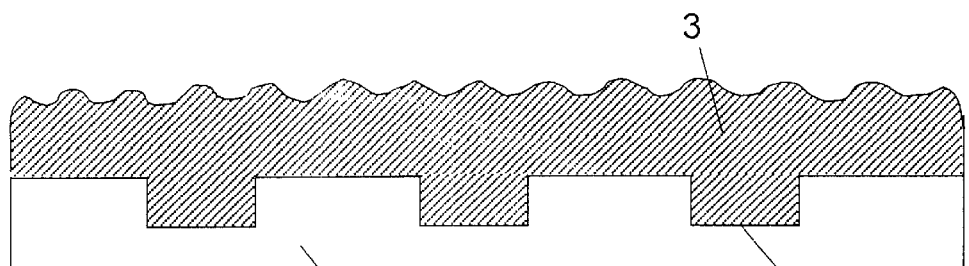
FIG. 2 shows the cast gas turbine components with a ceramic layer above the prefabricated profile for the cooling channels.

In FIG. 2, the gas turbine component 1 with a profile 2 is coated with a thermally stable filling material 3 in the form of another layer. The thermally stable filling material 3 masks the profile 2. It may be, for example, a ceramic material based on $Al_2O_3$ and/or $SiO_2$ and/or $ZrO_2$. For better distribution on the gas turbine component 1, the material in the shown exemplary embodiment is a slurry, i.e. a ceramic material still containing $H_2O$.

Figure 3:
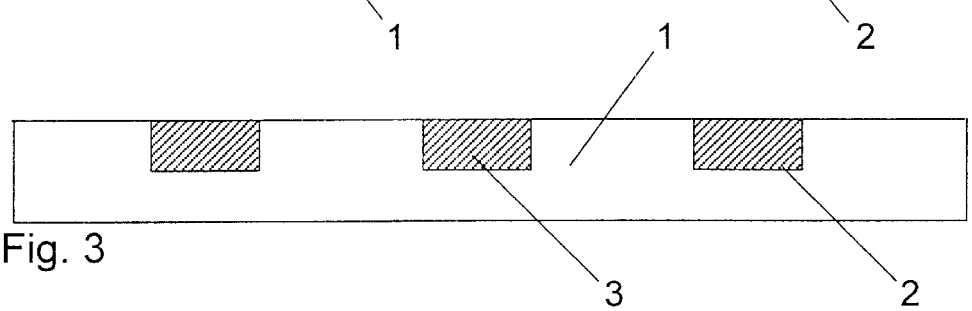
FIG. 3 shows the cast gas turbine component with a ceramic layer above the prefabricated profile for the cooling channels after removal of the superfluous material.

In FIG. 3, superfluous thermally stable filling material 3 has been removed above the profile 2, so that only the profile 2 is still masked. Between FIGS. 2 and 3, the gas turbine component 1 with the ceramic layer has been dried in order to dry the slurry and achieve a sufficient firmness of the slurry.

Figure 2A:
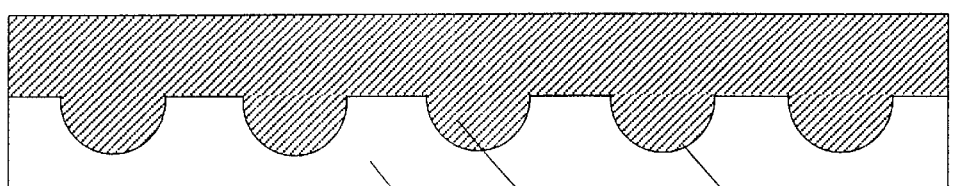
FIG. 2a shows the cast gas turbine components with a ceramic layer above the prefabricated, round profile for the cooling channels.
Figure 3A:
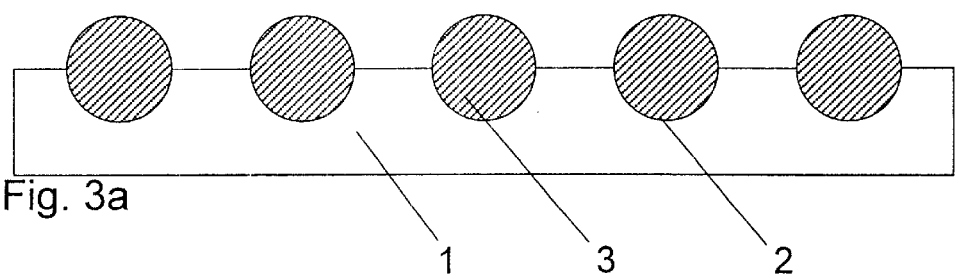
FIG. 3a shows a variation of FIG. 3 with a modified, round profile for the cooling channels.

As shown in FIG. 2a and 3a, it naturally would also be conceivable to create other shapes of the profile 2 for the cooling air structures. In FIGS. 2a and 3a, for example, the profile 2 is round, and the masking with the thermally stable filling material 3 is also done in a round shape. Other shapes would also be conceivable.

Figure 4:
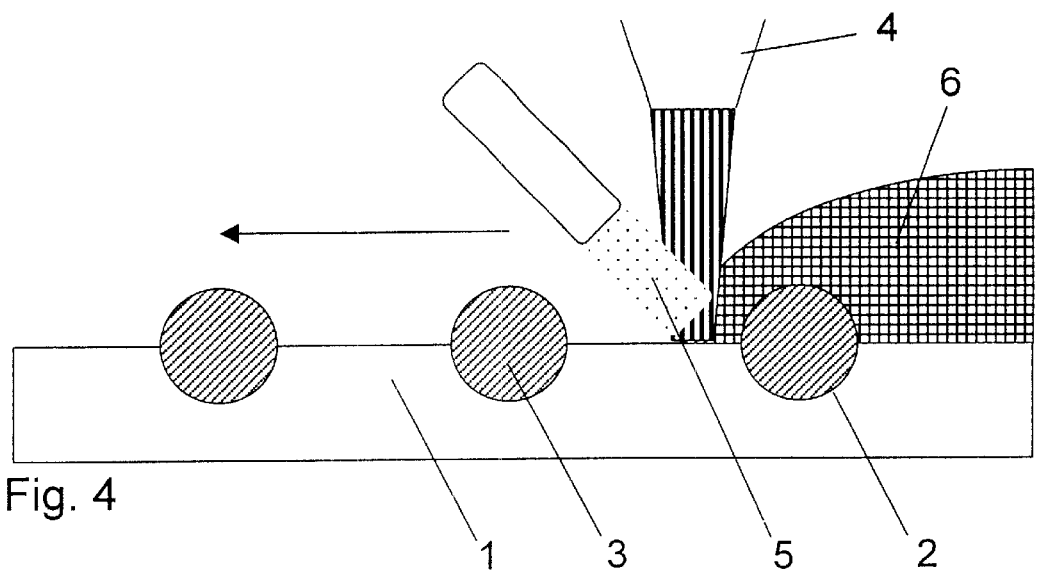
FIG. 4 shows the epitactic application of an additional layer onto the gas turbine component with the help of a laser and a powder above the material masked with the ceramic layer.

FIG. 4 shows how another monocrystalline layer 6 is created above the profile 3, which is masked with the thermally stable filling material 3, whereby an energy source, in the exemplary embodiment, a laser 4, and additional material, for example, a powder 5, are used. The growth direction of the monocrystalline layer 6 is indicated with an arrow. Such processes are known, for example, from European Offenlegungsschriften EP 892 090 A1 or EP 0740 976 A1; but similar processes may be used also. The powder 5 used can be the material of the super alloy which the gas turbine component 1 consists of. This may be, for example, an MK4 turbine blade with a composition as described in Table 1. Also conceivable would be an MK-4 turbine blade and a SV-20 composition as an epitactic, monocrystalline layer 6, which in this case simultaneously functions as a protective layer.

Figure 6:
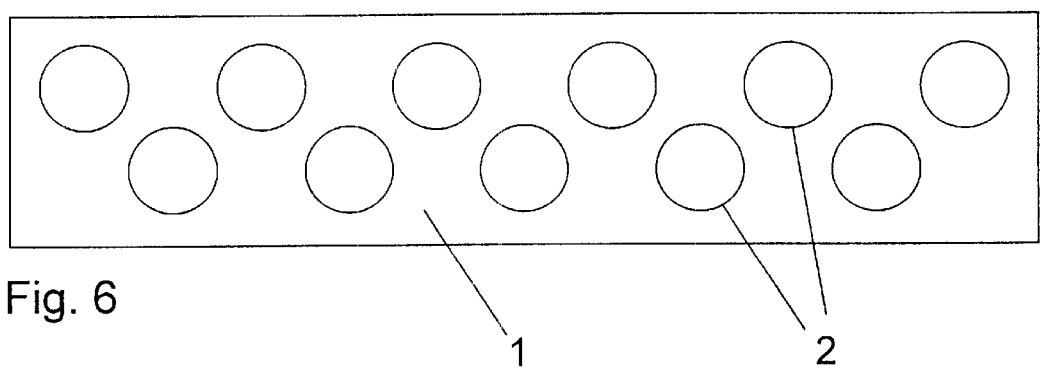
FIG. 6 shows the finished gas turbine component, whereby the cooling channels are no longer masked with the ceramic layer, and several cooling channels have been applied on top of each other by using the process according to the invention several times.

The composition of MK-4 or SV-20 (data in percent by weight)

is shown, for example, in FIG. 6. The thermally stable filling material 3 that masks the cooling channel was removed in another process step (not shown), for example, by etching or a similar process.

Figure 7:
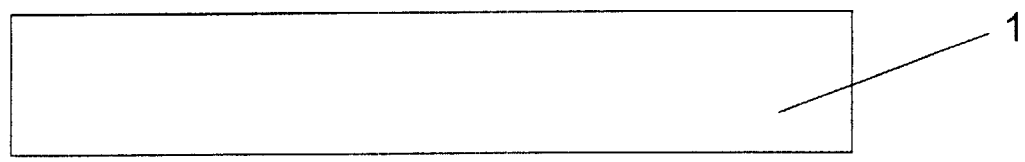
FIG. 7 shows a cast gas turbine component without a prefabricated profile for the cooling channels.
Figure 8:
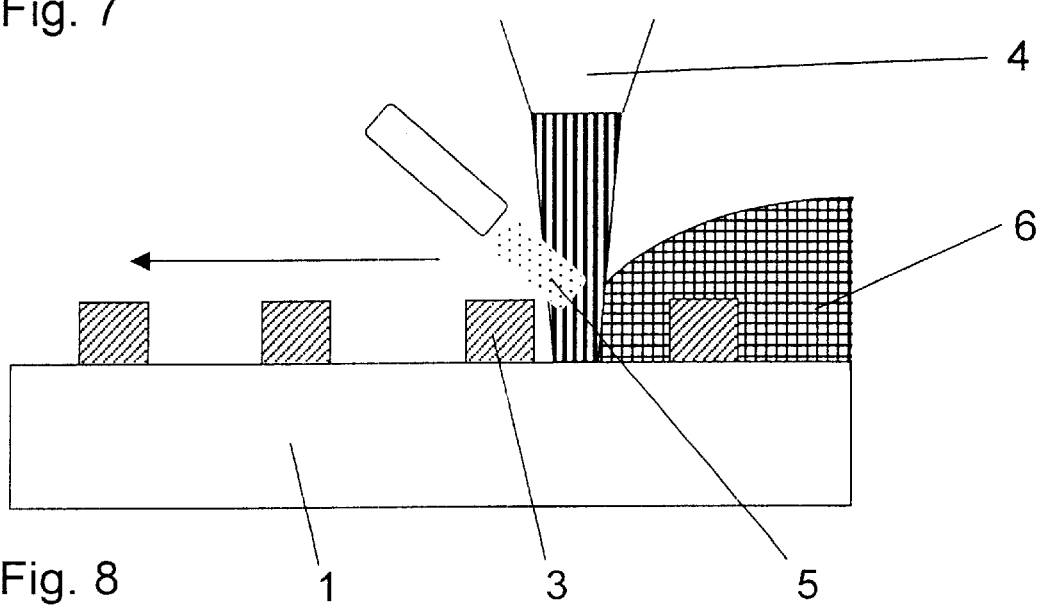
FIG. 8 shows a cast gas turbine component with ribs applied of a ceramic material, and the epitactic application of an additional layer onto the gas turbine component with the help of a laser and a powder above the gas turbine component masked with the ceramic ribs.
Figure 9:
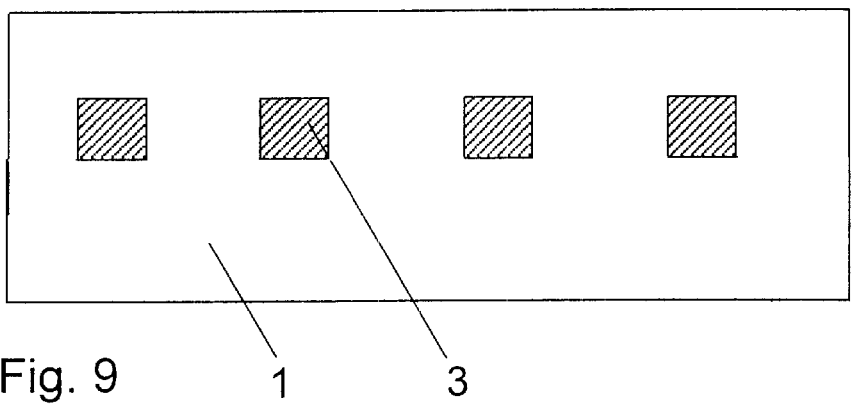
FIG. 9 shows a finished gas turbine component, whereby the cooling channels are still masked with the ceramic material.

Another possibility for producing the cooling channels of a gas turbine component 1 is shown in FIGS. 7 to 9. A gas turbine component 1 shown in FIG. 7 in this case does not yet contain a profile for the cooling channels. In FIG. 8, a thermally stable filling material 3 is applied onto the points of the gas turbine component 1 which are supposed to later function as cooling channels. The thermally stable filling material 3 here also consists of a ceramic material, based, for example, on $Al_2O_3$ and/or $SiO_2$ and/or $ZrO_2$, but it does not contain any $H_2O$ and thus becomes substantially firmer. Using a known process, an epitactic, monocrystalline layer 6, is again created with an energy source, for example a laser 4, and with additional material, for example a powder 5, over the gas turbine component 1 and the thermally stable filling material 3. The finished gas turbine component 1 is shown in FIG. 9, but the thermally stable filling material 3 has not yet been removed. The thermally stable filling material 3 is again removed by etching or similar processes.

Figure 10:
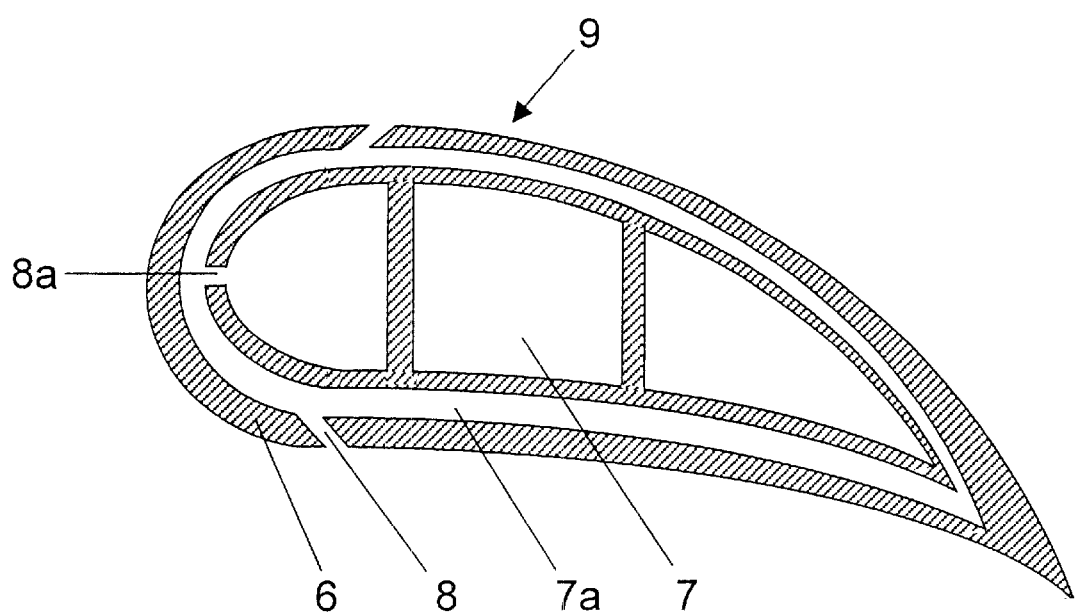
FIG. 10 shows a cross-section through a turbine blade with a cavity and integrated cooling channels.

FIG. 10 shows a section through a monocrystalline turbine blade 9 as an example for a gas turbine component. The turbine blade 9 consists of a base material (for example MK-4) and may be coated with a protective layer. It comprises a cooling system consisting of a cavity 7 and internal cooling channels 7a. The cooling channels 7a are connected via connecting holes 8a with the cavity 7 and via connecting holes 8 with the outside. The number of connecting holes 8, 8a shown in FIG. 10 is used only as an example and depends on the respective embodiment of the turbine blade 9. In order to produce the connecting holes 8, 8a during the production, drilling is necessary after the casting, since during the casting process only the internal cooling channels 7a are created. The monocrystalline layer 6 created epitactically around cooling channels 7a consists, as already described, of the base material of the turbine blade 9 or of a protective layer, for example SV-20. The cooling channels 7a and connecting holes 8a were masked during the epitactic production of the additional monocrystalline layer 6 with a thermally stable filling material 3.

Naturally, standard final controls in regard to quality assurance are maintained for all other production steps, such as, for example, the application of a thermal protective layer consisting of TBC (thermal barrier coating, Y stabilized Zr oxide), MCrAlY or similar materials onto the finished gas turbine component.

The process according to the invention is also suitable for repairing the cooling system of a chipped gas turbine component.

TABLE 1

|  | Ni | Cr | Co | Mo | W | Re | Al | Si | Ta | Ti | C | B | Y |
|---|---|---|---|---|---|---|---|---|---|---|---|---|---|
| MK-4 | rest | 6.5 | 9 | 0.6 | 6.5 | 3 | 5.6 | — | 6.6 | 1 | 0.03 | 0.005 | — |
| SV-20 | rest | 25 | — | — | — | — | 5.5 | 3 | 1 | — | — | — | 0.5 |

Figure 5:
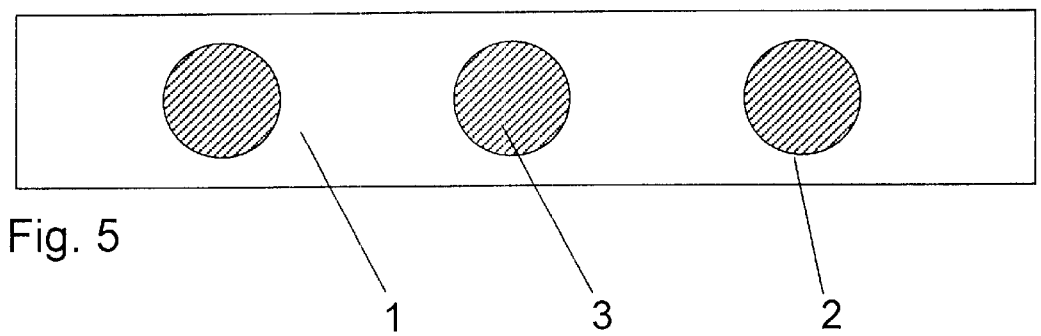
FIG. 5 shows the finished gas turbine component, whereby the cooling channels are still masked with the ceramic layer.

FIG. 5 shows the produced gas turbine component 1 on which the new, monocrystalline layer 6 has been created above the profile 2. The cooling channels are still masked with the thermally stable filling material 3.

The process according to the invention also can be performed several times consecutively so that several layers with a cooling profile are produced on top of each other. This

What is claimed is:

1. A method for producing or repairing cooling channels in monocrystalline gas turbine components, comprising:
   a) casting a monocrystalline gas turbine component;
   b) applying a thermally stable filling material;
   c) creating a monocrystalline layer epitactically above the thermally stable filling material; and d) removing the thermally stable filling material.

2. The method as claimed in claim 1, wherein a profile of the cooling channels is formed during casting.

3. The method as claimed in claim 1, wherein a profile of the cooling channels is formed by later machining on the gas turbine component.

4. The method as claimed in claim 1, wherein between the casting of the monocrystalline gas turbine component and the application of the thermally stable filling material, connecting holes are drilled that connect the cooling channels through a wall of the monocrystalline gas turbine component with an outside or with a cavity of the gas turbine component.

5. The method as claimed in claim 1, wherein the thermally stable filling material is a ceramic material or slurry.

6. The method as claimed in claim 5, wherein after the application of the ceramic material or slurry, the gas turbine component is dried along with the applied ceramic material or slurry, and superfluous ceramic material or slurry is removed.

7. The method as claimed in claim 1, including applying additional monocrystalline layers by repeating process steps b), c), and d) of claim 1.

8. The method as claimed in claim 1, including removing the thermally stable filling material by etching.

* * * * *